United States Patent
Grande et al.

(10) Patent No.: US 6,242,817 B1
(45) Date of Patent: Jun. 5, 2001

(54) FABRICATED WAFER FOR INTEGRATION IN A WAFER STRUCTURE

(75) Inventors: William J. Grande, Pittsford; Joseph E. Yokajty, Webster, both of NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/221,757

(22) Filed: Dec. 28, 1998

(51) Int. Cl.[7] .................................................. H01L 21/76
(52) U.S. Cl. .............................. 257/797; 257/48; 257/618; 257/620
(58) Field of Search .............................. 257/797, 48, 618, 257/620, 622

(56) References Cited

U.S. PATENT DOCUMENTS 5,236,118   8/1993   Bower et al. .
5,684,333 * 11/1997   Moriyama .

FOREIGN PATENT DOCUMENTS 43 17 623 A1   12/1994   (DE) .

OTHER PUBLICATIONS

M. Shimbo, K. Furukawa, K. Fukuda, and K. Tanzawa, "Silicon–to–Silicon Direct Bonding Method" from J. Appl. Phys. Oct. 15, 1986, pp. 2987–2989.
J. B. Lasky, "Wafer Bonding for Silicon–On–Insulator Technologies" from Appl. Phys. Lett 48, Jan. 6, 1986, pp. 78–80.

* cited by examiner

Primary Examiner—Kevin M. Picardat
Assistant Examiner—D. M. Collins
(74) Attorney, Agent, or Firm—Clyde E. Bailey, Sr.

(57) ABSTRACT

A fabricated wafer incorporates features suitable for integration in a multiple wafer structure. Such a wafer has a predetermined pattern formed therein comprising components for use in the multiple wafer structure and a plurality of locating features generally surrounding the predetermined pattern for cooperating with a mechanical aligning fixture.

4 Claims, 6 Drawing Sheets

FABRICATED WAFER FOR INTEGRATION IN A WAFER STRUCTURE

FIELD OF THE INVENTION

The invention relates generally to the field of wafer bonding. More particularly the invention concerns a fabricated wafer suitable for integration in a multiple wafer structure.

BACKGROUND OF THE INVENTION

Single wafer integration, wherein all the components of a device are formed simultaneously on one wafer, has been a standard and successful practice in the semiconductor industry for decades. In the emerging fields of micromechanics and microsystems, however, advanced designs increasingly require a multiple wafer integration strategy, where the various components of a device are fabricated onto a plurality of wafers and then the processed wafers are bonded together to form the final product. The design situations that necessitate multiple wafer integration include complicated three-dimensional geometries, incompatibilities among fabrication processes and, particularly, the need to build device components on a wide palette of non-silicon starting wafer material types.

A number of bonding techniques are known that can produce strong, reliable bonds between wafers. Fusion bonding is a direct bonding process where two clean, flat surfaces, such as silicon, silicon dioxide, or silicon nitride, are covalently bonded through the application of pressure and heat. In anodic bonding a silicon surface and a borosilicate glass surface are fused through the application of strong electric fields and heat. Adhesive bonding is applicable to the widest range of wafer materials, but the bond strengths achieved are typically lower than those for either fusion or anodic bonding. Independent of the bonding method used, the first step in wafer bonding is to position the wafers in fixed relation.

There are applications where wafer bonding is performed without a precise alignment of the wafers to be bonded. If at least one of the wafers contains no device features then only a very coarse alignment may be necessary. This is the case for high purity silicon on insulator (SOI), where a bare silicon wafer is fusion bonded to a silicon dioxide-coated silicon wafer, and also when a bare wafer is bonded to a device wafer to serve as a cap or seal. In general, however, wafer bonding requires the initial steps of accurately aligning the components of a first wafer with the components of a second wafer and then holding the wafers in fixed relation for the bonding process.

Current methods for aligning wafers prior to bonding are time-consuming and require expensive equipment. In U.S. Pat. No. 5,236,118, entitled, "Aligned Wafer Bonding" by Bower et al. describes a wafer bonding process which uses a wafer aligned with precision mechanical stages and a sophisticated imaging system to optically align the wafers. The Bower et al patent teaches the use of infrared viewing to facilitate alignment of wafers. Wafer aligners based on infrared or alternative optical techniques are offered commercially by several semiconductor equipment manufacturers. They compare in complexity and price to lithographic contact aligners and require a similarly high level of skill to operate. For high volume manufacturing of wafer bonded devices, it would be advantageous to have a wafer bonding process with a low-cost wafer alignment step that did not require expensive capital equipment and could be performed quickly by unskilled operators or robotic assemblers. The use of commercial wafer aligners is currently restricted to the alignment of two wafers at one time. It would be a further advantage then to have a wafer alignment process that, in addition to the aforementioned benefits, could align three or more wafers for simultaneous bonding.

SUMMARY OF THE INVENTION

It is, therefore, an object of the invention, to provide precisely aligned fabricated wafers prior to bonding without the need for costly mechanical stages or imaging systems.

Another object of the invention is to provide precisely aligned fabricated wafers prior to bonding where the wafers contain features or materials that are incompatible with optical aligning techniques.

Still another object of the invention is to provide locating features on fabricated wafers that facilitate precise alignment prior to bonding.

Yet another object of the invention is to provide an apparatus suitable for the precise alignment of three or more fabricated wafers for simultaneous bonding.

To accomplish these and other objects of the invention, there is provided a fabricated wafer for integration in a multiple wafer structure, comprising:

a substantially planar substrate having a first face and a second opposite face, at least one of said first and second faces having a predetermined pattern thereon, said predetermined pattern comprising prearranged components for use in said multiple wafer structure, and a plurality of locating features generally surrounding said predetermined pattern, said locating features being fixedly arranged on said substantially planar substrate for cooperating with a mechanical aligning fixture, and wherein said locating features have a minimum number of contact points to constrain said wafer to said mechanical assembly jig.

The fabricated wafer of the present invention has numerous advantageous effects over existing developments including: low cost; and ease and speed of manufacture. Moreover, a further advantage of the fabricated wafer of the invention is that it provides for alignment of multiple wafers for simultaneous bonding.

BRIEF DESCRIPTION OF THE DRAWINGS

The foregoing as well as other objects, features and advantages of this invention will become more apparent from the appended Figures, wherein like reference numerals denote like elements, and wherein.

DETAILED DESCRIPTION OF THE INVENTION

Figure 1:
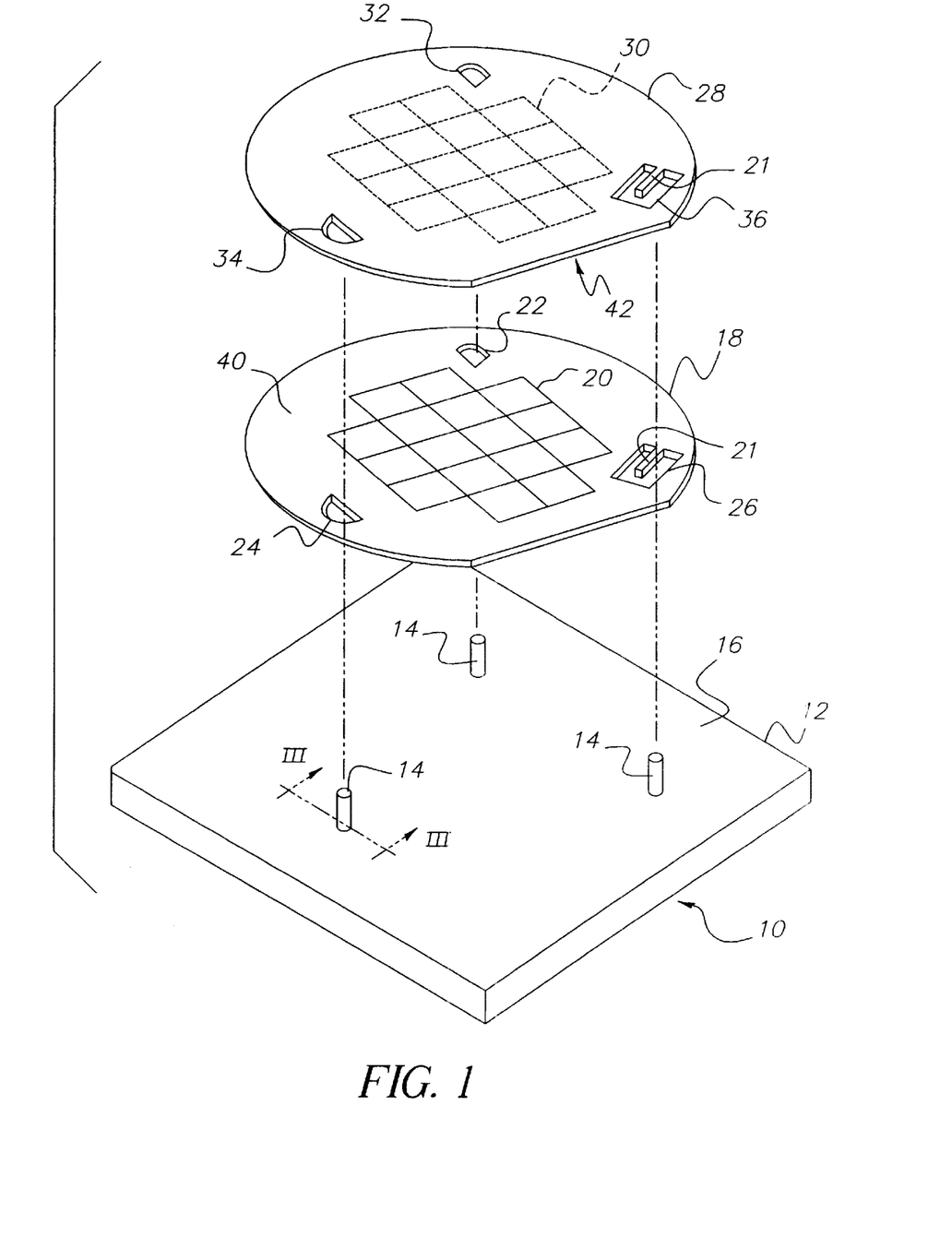
FIG. 1 is an exploded view of an apparatus for aligning wafers for bonding.
Figure 2:
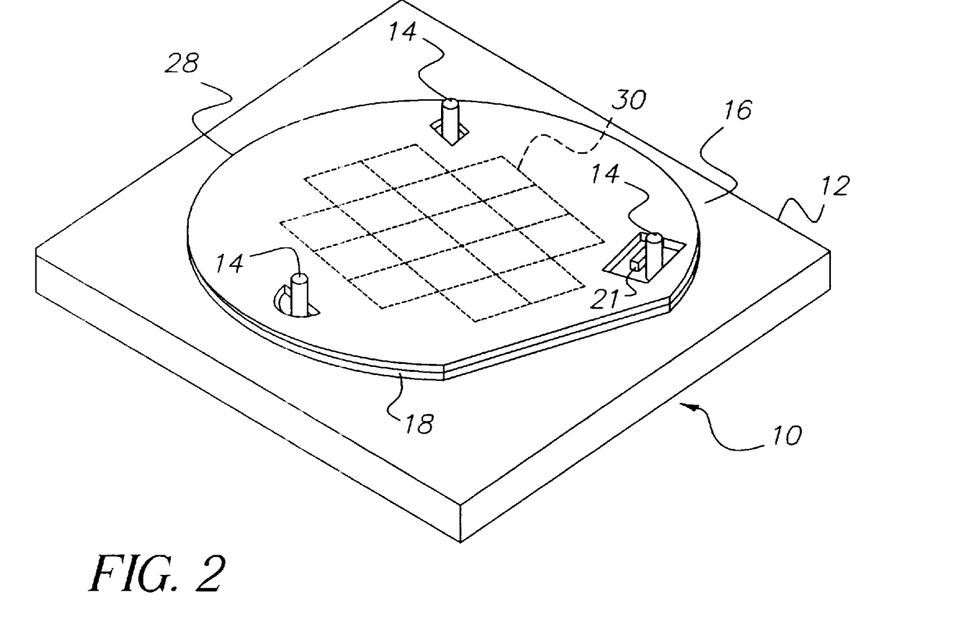
FIG. 2 is an oblique view of the wafers positioned on an aligning platform.

Referring now to the drawings and particularly to FIGS. 1 and 2, the method for registrably aligning fabricated wafers prior to bonding, broadly defined, includes the steps of providing an assembly jig 10 consisting of a substantially planar platform 12 having a plurality of upstanding aligning elements 14 spatially arranged about one face 16 of the platform. FIGS. 1 and 2 illustrate one preferred embodiment wherein three upstanding aligning elements 14 are employed.

According to FIG. 1, first wafer 18 suitable for bonding has a first predetermined pattern 20 formed therein and a predetermined number of first locating features 22, 24, and 26 corresponding to the three upstanding aligning elements 14 on platform 12. It is important to our invention that each one of the first locating features 22, 24, and 26 has a predetermined spatial relationship with the first predetermined pattern 20.

Referring again to FIG. 1, a second wafer 28 is provided for bonding to the first wafer 18. Second wafer 28 has a second predetermined pattern 30 formed therein and a predetermined number of second locating features 32, 34, and 36 also corresponding to the three upstanding aligning elements 14 on the platform 12. Similar to the first locating features 22, 24, and 26, each one of the second locating features 32, 34, and 36 has a predetermined spatial relationship with the second predetermined pattern 30.

Referring to FIG. 2, once the wafers 18, 28 for bonding are provided, they must then be registrably aligned on the assembly jig 10. Thus, each one of the predetermined number of first locating features 22, 24, and 26 of the first wafer 18 is registrably aligned with a corresponding one of the upstanding aligning elements 14 on the platform 12.

Next according to the method of the invention, each one of the predetermined number of first locating features 22, 24, and 26 of the first wafer 18 is arranged about a correspondingly aligned upstanding aligning elements 14 on platform 12.

Referring to FIG. 1, in a similar manner, each one of the predetermined number of second locating features 32, 34, and 36 of the second wafer 28 is registrably aligned with a corresponding upstanding aligning elements 14 on platform 12.

Still referring to FIG. 1, finally, each one of the predetermined number of second locating features 32, 34, and 36 of second wafer 28 is arranged about a correspondingly aligned upstanding aligning elements 14 on platform 12 such that a face 40 of the first wafer is in intimate contact with a face 42 of the second wafer in preparation for bonding. FIG. 2 shows the first wafer 18 and the second wafer 28 registrably aligned to each other with their respective faces 40 and 42 (not visible) in intimate contact and ready for bonding.

The preferred alignment mechanism of the present invention is kinematic alignment of the wafers 18, 28. According to kinematic design principles, an object can be precisely and repeatably aligned by establishing point contact at the minimum number of points required to restrain the object in a desired position and orientation. Fixing an object in space requires six points of contact, but since the platform face 16 constrains the wafers 18, 28 in a plane, only three additional points of contact are needed for accurate alignment. Further preferred embodiments of the invention are easily understood in view of the kinematic design principle.

Figure 3:
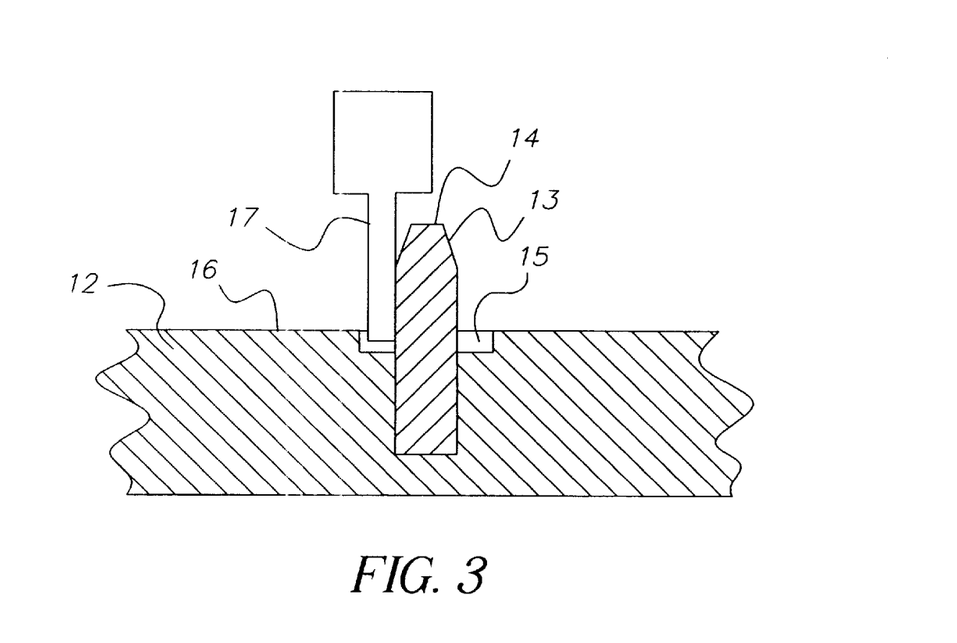
FIG. 3 is a partial cross-sectional view taken along line III—III of FIG. 1 showing a preferred construction method.

Referring to FIGS. 1 and 3, proper construction of assembly jig 10 is important to the present invention. Flatness of the platform face 16 can be assured by known precision machining methods, such as jig grinding, cylindrical grinding, and jig boring. We prefer using jig grinding. It is also crucial that the upstanding aligning elements 14 be perpendicular to the platform face 16. Deviations from perpendicularity may cause alignment error between wafers 18, 28. In FIG. 3, the preferred construction method for the upstanding aligning elements 14 is depicted as taken along section line III—III of FIG. 3. Upstanding aligning element 14 is seated into a machined hole (not explicitly shown) in platform 12. A counter bore pocket 15 provides clearance for a jig grinding tool 17 which provides a precise perpendicular finish to the outer surface of the upstanding aligning element 14. It is preferable that all the upstanding aligning elements 14 be jig ground in a single set-up operation. To aid in the aligning process, a taper 13 is formed in the upstanding aligning element 14 either before or after insertion into platform 12.

The assembly jig 10 is preferably constructed of materials selected from the group consisting of aluminum, stainless steel, tool steel, ferrous alloys, nickel, nickel alloys, molybdenum, tungsten, quartz, aluminum oxide, tungsten carbide, ceramics, and low thermal coefficient of expansion alloys such as invar. Selection of the preferred material for fabricating assembly jig 10 is governed by intended application of the bonding method expected to be used. For instance, if the assembly jig 10 includes heating means (not shown) to facilitate the bonding process, then materials with high thermal conductivity should be used, such as nickel.

Figure 4:
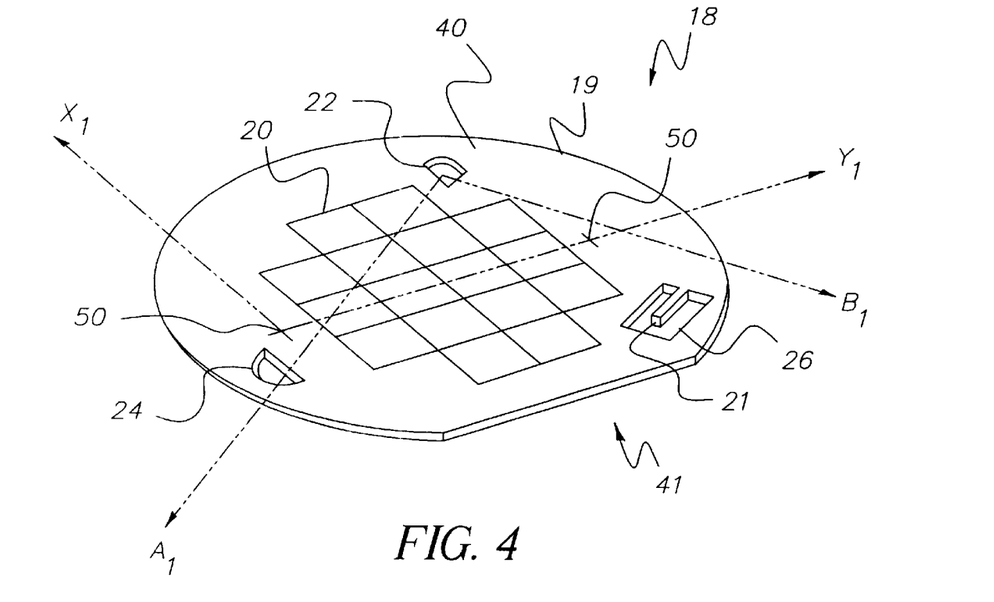
FIG. 4 is an oblique view of a wafer showing specific features important to the present invention.

Referring now to FIG. 4, a first wafer 18 is provided with specific features and aspects important to the invention. First wafer 18 comprises a substrate 19, the first wafer face 40, and an opposite first wafer face 41. A first predetermined pattern 20 of device components is formed on first wafer face 40 of first wafer 18.

In wafer-based fabrication, device components are generally formed through a series of individual process steps including lithographic definition, material removal (e.g. plasma etching), and material deposition (e.g. sputtering and physical vapor deposition). The size, shape, and position of component features is determined by the lithographic definition steps.

To facilitate the alignment of successive lithographic definition steps, a reference coordinate system, shown as arrows $X_1$-$Y_1$, in FIG. 4, is established by forming alignment marks 50 on wafer 18. Using known lithographic art, the device components contained in the first predetermined pattern 20 can be formed with a positional accuracy of the order of 0.1 micrometers ($\mu$m) or better relative to alignment marks 50 and the coordinate system $X_1$-$Y_1$.

Referring again to FIG. 4, a set of first locating features 22 24, and 26 are provided, preferably at the periphery of wafer 18. The first locating features 22, 24, and 26 are openings that extend completely through wafer 18. There are a number of known techniques suitable for the production of locating features 22, 24, and 26. In silicon wafers it is preferable to plasma etch first locating features 22, 24, and 26. The plasma etching technique known as the "Bosch Process" and described in German Pat. No. DE 43 17 623 A 1 has been commercialized by several semiconductor equipment manufacturers. The Bosch Process provides fast, anisotropic etching of silicon and is a particularly suitable fabrication method. Photoetchable glass such as Foturan™ made by Schott Corporation is suitable for forming first locating features 22, 24, and 26 in glass wafers. Other well known methods including molding, electroforming, drilling, laser ablation, and electro-discharge machining may be suitable to form locating features in wafers of other materials.

According to FIG. 4, the set of first locating features 22, 24, and 26 establish a second coordinate system as indicated by arrows $A_1$-$B_1$. First locating features 22, 24, and 26 are formed through a series of individual process steps including lithography and etching. The size, shape, and position of the first locating features 22, 24, and 26 are determined by the lithographic definition steps which are referenced to the alignment marks 50 and the coordinate system $X_1$-$Y_1$.

Referring now to FIGS. 5A–5E, fragmentary sections of sidewall profile 62 of first locating features 22, 24, and 26 of first wafer 18 are depicted. Sidewall profile 62 is governed by etch mask 60 and specific etching conditions. In FIGS. 5A–5E, reference line A—A designates the vertical plane defined by the end edge of etch mask 60 which establishes the coordinate system $A_1$-$B_1$, as shown in FIG. 4. Using known lithographic art, etch mask 60 can be formed with a positional accuracy of the order of 0.1 $\mu$m or better relative to alignment marks 50 and the coordinate system $X_1$-$Y_1$. Thus, the root mean square alignment accuracy of the first predetermined pattern 20 to the first locating features 22, 24, and 26 will be on the order of 0.14 $\mu$m or better, assuming that etching of the locating features 22, 24, and 26 can be performed with high fidelity to the etch mask 60. FIGS. 5A–5D schematically show a variety of sidewall profiles 62 that may be produced in practice.

Figure 5A:
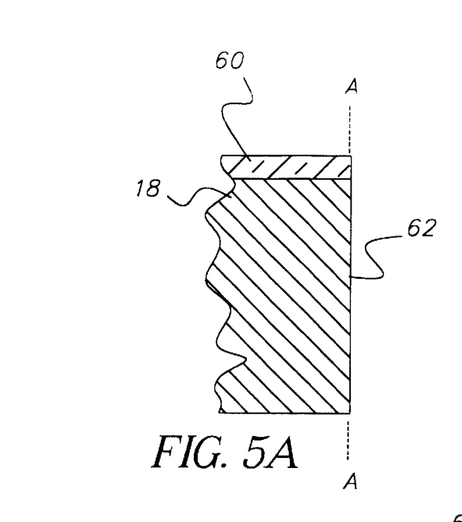
FIGS. 5A–5E are fragmentary section views of various possible sidewall profiles of locating features etched on the fabricated wafer of the invention.
Figure 5B:
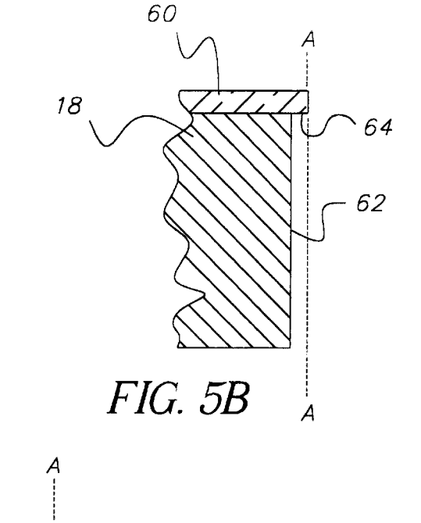
Figure 5C:
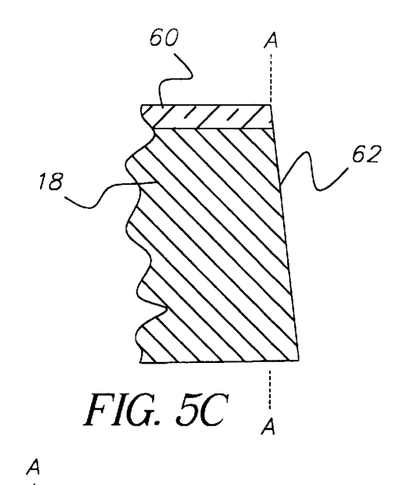

According to FIG. 5A, a perfectly vertical sidewall profile 62 is depicted with no undercutting of the etch mask 60. This is one preferred embodiment of sidewall profile 62. In FIG. 5B, the etch conditions have produced a vertical sidewall profile 62 but with an undercut 64 of the etch mask 60. If the amount of undercut 64 is reproducible on all the wafers to be bonded then this profile can give satisfactory aligning results. According to FIG. 5C, the etching conditions have produced a sidewall profile 62 that slopes away from the etch mask 60. Such a profile is called "overcut." If strict control can be kept over the amount of overcut and the thickness of the wafers to be aligned, then the profile of FIG. 5C may give acceptable alignment results; however, the condition of FIG. 5C is to be generally avoided.

Figure 5D:
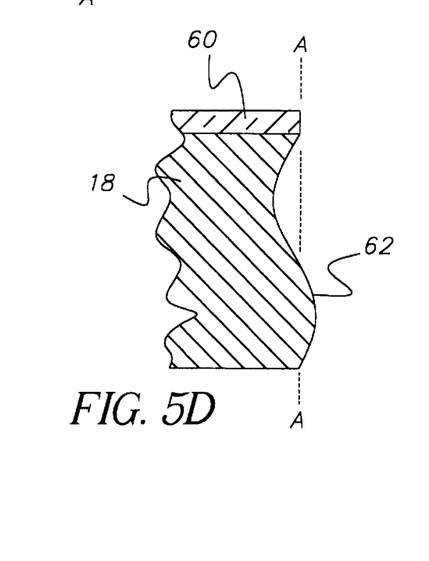
Figure 5E:
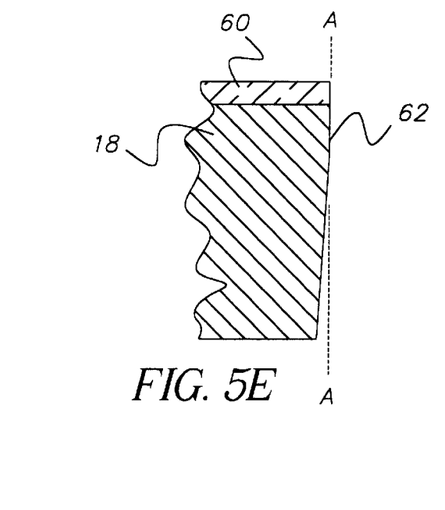

Referring to FIG. 5D, an unacceptable sidewall profile 62 is illustrated where fluctuations in the etch process have created an unpredictable modulation. Recalling that the kinematic principle specifies point contact to positionally determine an object, we note that in practice true point contact can never be achieved between two objects because of material deformation. In FIG. 5E, another preferred embodiment is illustrated, where the sidewall profile 62 is initially vertical and then tapers away in the so-called "undercut" profile. This sidewall profile 62 (as illustrated in FIG. 5E) provides a predictable contact site along the vertical plane A—A which facilitates accurate alignment with upstanding element 14. This configuration of sidewall profile 62, moreover, assures that the contact site will be closely aligned with end edge A—A of the etch mask 60.

Referring to FIGS. 1 and 2, a second wafer 28 is provided for aligning and bonding to first wafer 18. The details of construction of second wafer 28 are similar to those of first wafer 18, including the establishment of two coordinate systems based on alignment marks and locating features. A distinction between wafer 18, 28 is that second locating features 32, 34, and 36 on second wafer 28 may be mirrored in orientation relative to first locating features 22, 24, and 26 on first wafer 18. This is done in order to obtain the desired contact of first wafer face 40 to second wafer face 42, as shown in FIGS. 1 and 2.

Figure 6:
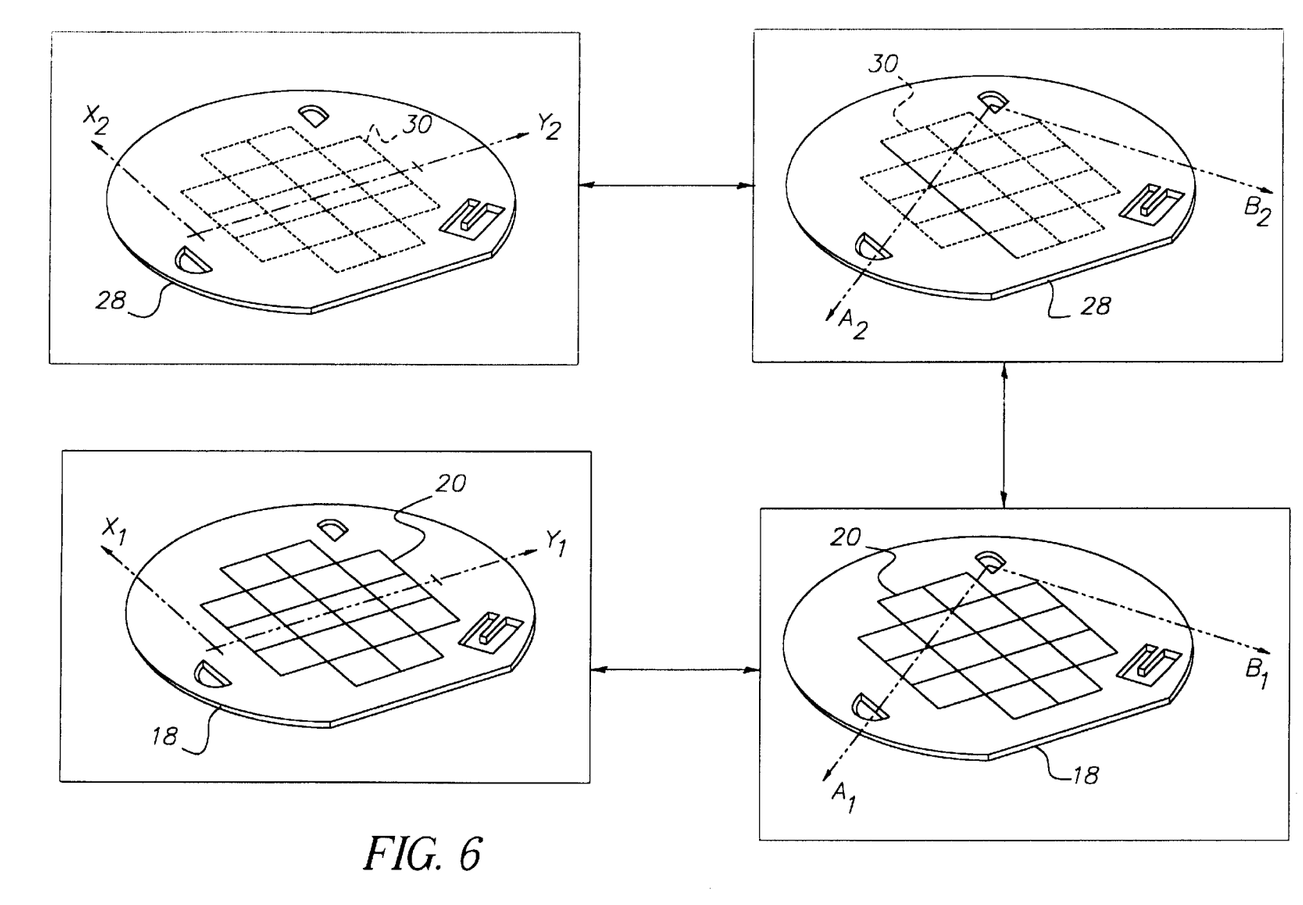
FIG. 6 is a process diagram showing alignment relationships.

FIG. 6 illustrates the alignment architecture involved in aligning two wafers 18, 28 according to the present invention. First and second wafers 18, 28 are provided with first and second predetermined patterns of device components 20, 30, respectively, arranged with respect to coordinate systems $X_1$-$Y_1$ and $X_2$-$Y_2$, respectively. The goal of aligning coordinate systems $X_1$-$Y_1$ and $X_2$-$Y_2$ is achieved by creating auxiliary coordinate systems, $A_1$-$B_1$ and $A_2$-$B_2$, based on locating features, which can be simply and accurately aligned using the method of the present invention. As described above, the alignment accuracy of $A_1$-$B_1$ with respect to $X_1$-$Y_1$ and, similarly, $A_2$-$B_2$ with respect to $X_2$-$Y_2$ is determined by photolithography and etch processes and can be held to the order of 0.14 $\mu$m or better. Jig assembly 10 alignment technique of the present invention should be capable of aligning coordinate system $A_1$-$B_1$ to $A_2$-$B_2$ with accuracy of the order of 1.0 $\mu$m or better. Thus, the predetermined patterns of device components 20, 30 on the two wafers 18, 28 can be aligned with accuracy of the order of 1.0 $\mu$m or better without the use of expensive mechanical stages or complex optical alignment systems.

Figure 7:
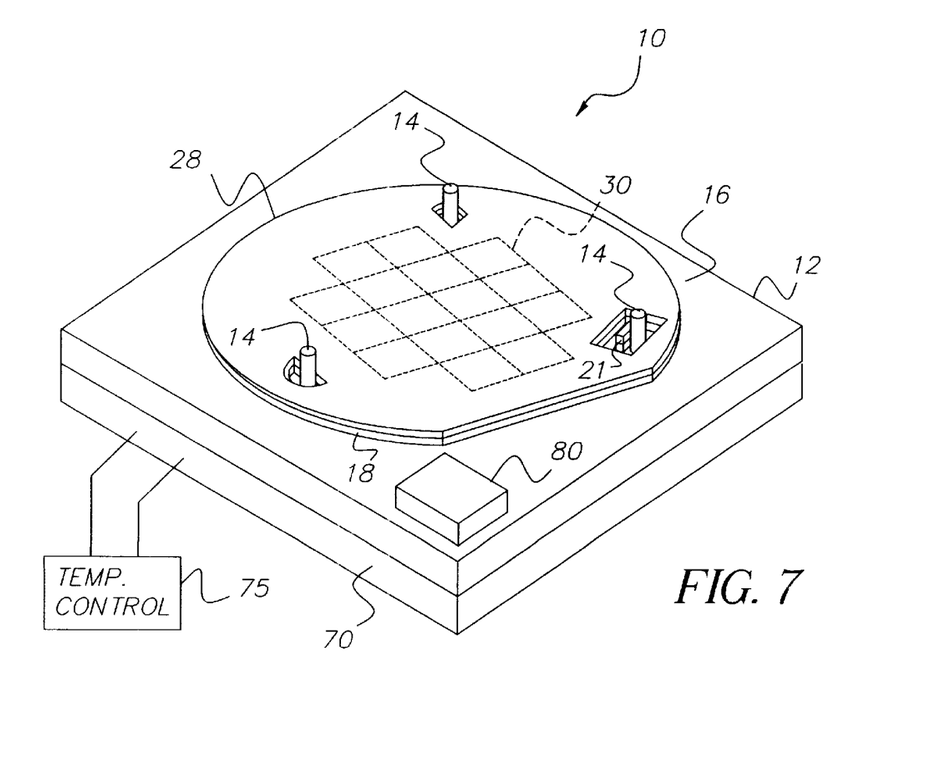
FIG. 7 is an oblique view of the wafers positioned on an assembly jig which contains an ultrasonic transducer and a heater.

Referring now to FIG. 7, the assembly jig 10 is equipped with a vibration transducer 80 to apply vibrational energy to the first wafer 18 and second wafer 28 to assist in arranging the wafers onto upstanding aligning elements 14. The vibrational energy is preferably in the frequency range of 1 KHz to 100 MHz. To aid thermally based bonding techniques, the assembly jig 10 may be equipped with a heater 70 and temperature controller 75.

Referring again to FIG. 4, the geometry of the locating features 22, 24, and 26 is of particular importance to the present invention. In one preferred embodiment locating feature 22 has a substantially V-shape through-opening in wafer 18 for providing two points of contact with an upstanding aligning element 14. In another preferred embodiment locating feature 24 is a through-opening in wafer 18 with at least one substantially straight edge for providing a single point of contact with an upstanding aligning element 14. In yet another preferred embodiment locating feature 26 comprises a biasing means for mechanically preloading the wafer 18 on assembly jig 10. One preferred biasing means is a cantilever-shaped spring 21 also shown in FIGS. 1, 2, and 4. Other spring shapes employing multiple cantilevers, serpentines, and other geometries are well known in the art and may be employed in the present invention. In general, the spring shape, taking into account the mechanical stiffness of the wafer material, will be optimized for best alignment performance on a case-by-case basis.

Figure 8A:
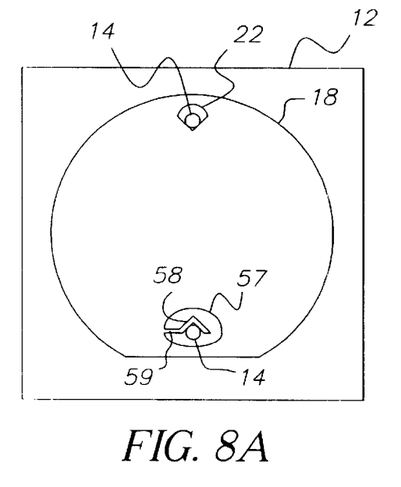
FIGS. 8A–8D are top views of various configurations of aligning elements and locating features.
Figure 8B:
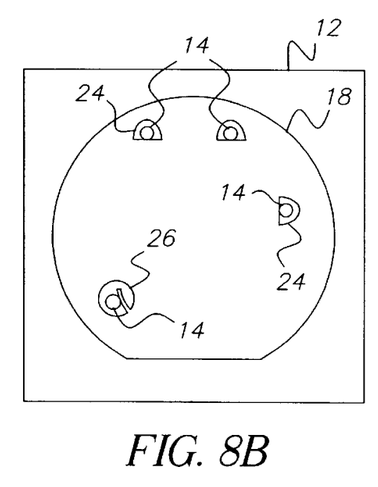
Figure 8C:
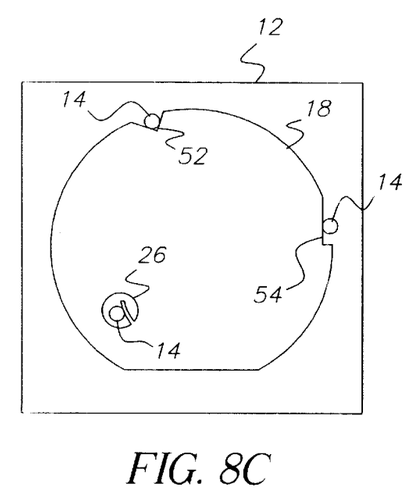
Figure 8D:
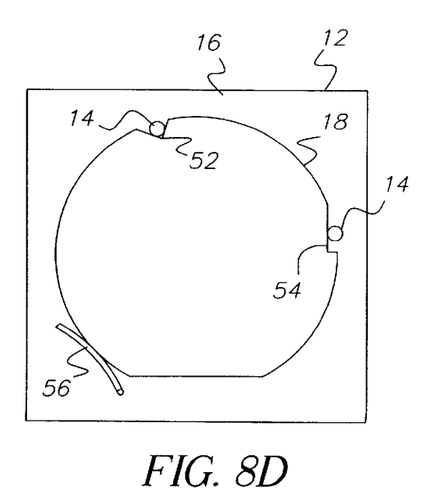

Referring to FIGS. 8A–8D, top views of various configurations of upstanding aligning elements 14 and locating features 22, 24, 26, 52, 54, 57 are illustrated. FIG. 8A shows a preferred embodiment wherein only two upstanding aligning elements 14 are required. Locating feature 22 provides two points of contact between the wafer 18 and the upstanding aligning element 14. Locating feature 57 includes a contoured portion 58 and a biasing member 59, wherein the contoured portion 58 defines a rotational alignment of wafer 18 and the biasing member 59 preloads wafer 18 against the upstanding aligning element 14. According to FIG. 8B, an alternative embodiment is depicted in which four upstanding aligning elements 14 are used. Three locating features 24 each provide a single point of contact for kinematic alignment while locating feature 26 provides preloading. Referring to FIGS. 8C and 8D, preferred embodiments are illustrated wherein locating features are moved further to the wafer periphery in order to maximize the area available for device component fabrication.

In FIG. 8C, the wafer is provided with a substantially V-shaped notched locating feature 52 wherein the V-shaped surfaces form part of the outer edge of wafer 18. The V-shaped notched locating feature 52 provides two points of contact between the wafer and the upstanding aligning element 14. The third point of contact is provided by a substantially straight-edged notched locating feature 54, wherein the straight-edged surface forms part of the outer edge of wafer 18. In FIG. 8C locating feature 26 provides preloading.

FIG. 8D illustrates an alternative embodiment wherein preloading is provided by an external preloading means 56. The external preloading means 56 is preferably a spring affixed to platform 12. If platform 12 is oriented such that the platform face 16 is substantially vertical, then the external preloading means 56 can be an external weight or the weight itself of wafer 18.

As illustrated in FIGS. 1 and 2, it will be appreciated that wafers 18, 28 to be aligned may have device features on one face only. Alternatively, wafers 18, 28 may have device features on both opposite faces or there may be no device features on either face. Also, it will be recognized that the present invention is well adapted to aligning three or more wafers simultaneously by repeating the aligning sequence shown in FIGS. 1 and 2.

The invention has been described with reference to preferred embodiments. However, it will be appreciated that variations and modifications can be effected by a person of ordinary skill in the art without departing from the scope of the invention.

PARTS LIST

- 10 assembly jig
- 12 platform
- 13 taper
- 14 upstanding aligning elements
- 15 counter bore pocket
- 16 platform face
- 17 jig grinding tool
- 18 first wafer
- 19 substrate
- 20 first predetermined pattern
- 21 spring
- 22 first locating feature
- 24 another first locating feature
- 26 yet another first locating feature
- 28 second wafer
- 30 second predetermined pattern
- 32 second locating feature
- 34 another second locating feature
- 36 yet another second locating feature
- 40 first wafer face
- 41 opposite first wafer face
- 42 second wafer face
- 50 alignment marks
- 52 V-shaped notched locating feature
- 54 straight-edged notched locating feature
- 56 external preloading means
- 57 locating feature
- 58 contoured portion
- 59 biasing member
- 60 etch mask
- 62 sidewall profile
- 64 undercut
- 70 heater
- 75 temperature controller
- 80 vibration transducer

What is claimed is:

1. A fabricated wafer for integration in a multiple wafer structure, comprising:

a substantially planar substrate having a first face and an opposite face, at least one of said first face and second opposite face having a predetermined pattern thereon, said predetermined pattern comprising prearranged components for use in said multiple wafer structure, and a plurality of locating features generally surrounding said predetermined pattern, said locating features being fixedly arranged on said substantially planar substrate for cooperating with a mechanical assembly jig comprising a platform, and wherein said locating features has a through opening in the wafer with at least one substantially straight edge for providing a single point of contact with the assembly jig thereby constraining said wafer to said mechanical assembly jig.

2. The wafer recited in claim 1 wherein at least one of said locating features comprises a biasing means for mechanically preloading the wafer on the assembly jig.

3. The wafer recited in claim 1 wherein at least one of said locating features has a substantially V-shape through-opening in the wafer for providing two points of contact with the assembly jig.

4. The wafer recited in claim 1 wherein said each one of said plurality of locating features on said wafer is formed for corresponding to one of said plurality of upstanding aligning elements on said platform, and wherein each one of the locating features has a predetermined spatial relationship with said predetermined pattern.

* * * * *